US008508997B2

(12) United States Patent
Tang et al.

(10) Patent No.: US 8,508,997 B2
(45) Date of Patent: Aug. 13, 2013

(54) MULTI-CELL VERTICAL MEMORY NODES

(75) Inventors: Sanh D. Tang, Boise, ID (US); Nishant Sinha, Boise, ID (US); John Zahurak, Eagle, ID (US)

(73) Assignee: Intel Corporation, Santa Clara, CA (US)

( * ) Notice: Subject to any disclaimer, the term of this patent is extended or adjusted under 35 U.S.C. 154(b) by 367 days.

(21) Appl. No.: 12/646,847

(22) Filed: Dec. 23, 2009

(65) Prior Publication Data
US 2011/0149656 A1 Jun. 23, 2011

(51) Int. Cl.
*G11C 11/34* (2006.01)

(52) U.S. Cl.
USPC .................................................... 365/185.17

(58) Field of Classification Search
USPC .................................................... 365/185.17
See application file for complete search history.

(56) References Cited

U.S. PATENT DOCUMENTS

| 6,373,553 | B1 | 4/2002 | Singh |
| 6,618,791 | B1 | 9/2003 | Dodd et al. |
| 7,470,492 | B2 | 12/2008 | Bigwood et al. |
| 7,539,812 | B2 | 5/2009 | Tetrick |
| 2005/0133851 | A1 | 6/2005 | Forbes |
| 2005/0265076 | A1* | 12/2005 | Forbes ..................... 365/185.17 |
| 2005/0269626 | A1 | 12/2005 | Forbes |
| 2005/0287795 | A1 | 12/2005 | Torek et al. |
| 2008/0242034 | A1 | 10/2008 | Mokhlesi et al. |
| 2009/0035584 | A1 | 2/2009 | Tran et al. |
| 2009/0072303 | A9 | 3/2009 | Prall et al. |
| 2009/0180324 | A1 | 7/2009 | Ramaswamy et al. |
| 2009/0258492 | A1 | 10/2009 | Sant et al. |
| 2009/0294828 | A1* | 12/2009 | Ozawa et al. ................. 257/319 |

OTHER PUBLICATIONS

Jang, Jaehoon, et al., "Vertical Cell Array TCAT (Terabit Cell Array Transistor) Technology for Ultra High Density NAND Flash Memory", 2009 Symposium VSLI Technology, (2009), pp. 1-2.
Komori, Yosuke, et al., "Disturbless Flash Memory due to High Boost Efficiency on BiCS Structure and Optimal Memory Film Stack for Ultra High Density Storage Device", Center for Semiconductor Research & Development, Toshiba Corporation, Semiconductor Company, Toshiba Information Systems (Japan) Corporation;, (2009), pp. 1-3.
Maeda, Takashi, et al., "Muti-stacked 1G cell/layer Pipe-shaped BiCS Flash Memory", Center for Semiconductor Reasearch & Deverlopment, Toshiba Corporation, Semiconductor Company; 2009 Symposium on VLSI Circuits Digest of Technical Papers, (2009), pp. 1-2.

* cited by examiner

*Primary Examiner* — Anthan Tran
(74) *Attorney, Agent, or Firm* — Blakely, Sokoloff, Taylor & Zafman LLP

(57) ABSTRACT

Embodiments of the invention pertain to vertical memory structures. Embodiments of the invention describe memory nodes comprising two memory cells on opposing sides of a vertical channel separating a source region and a drain region. Embodiments of the invention may utilize floating gate NAND memory cells, polysilicon diodes, MiM diodes, or MiiM diodes. Embodiments of the invention may be used to form flash memory, RRAM, Memristor RAM, Oxide Ram or OTPROM.

13 Claims, 7 Drawing Sheets

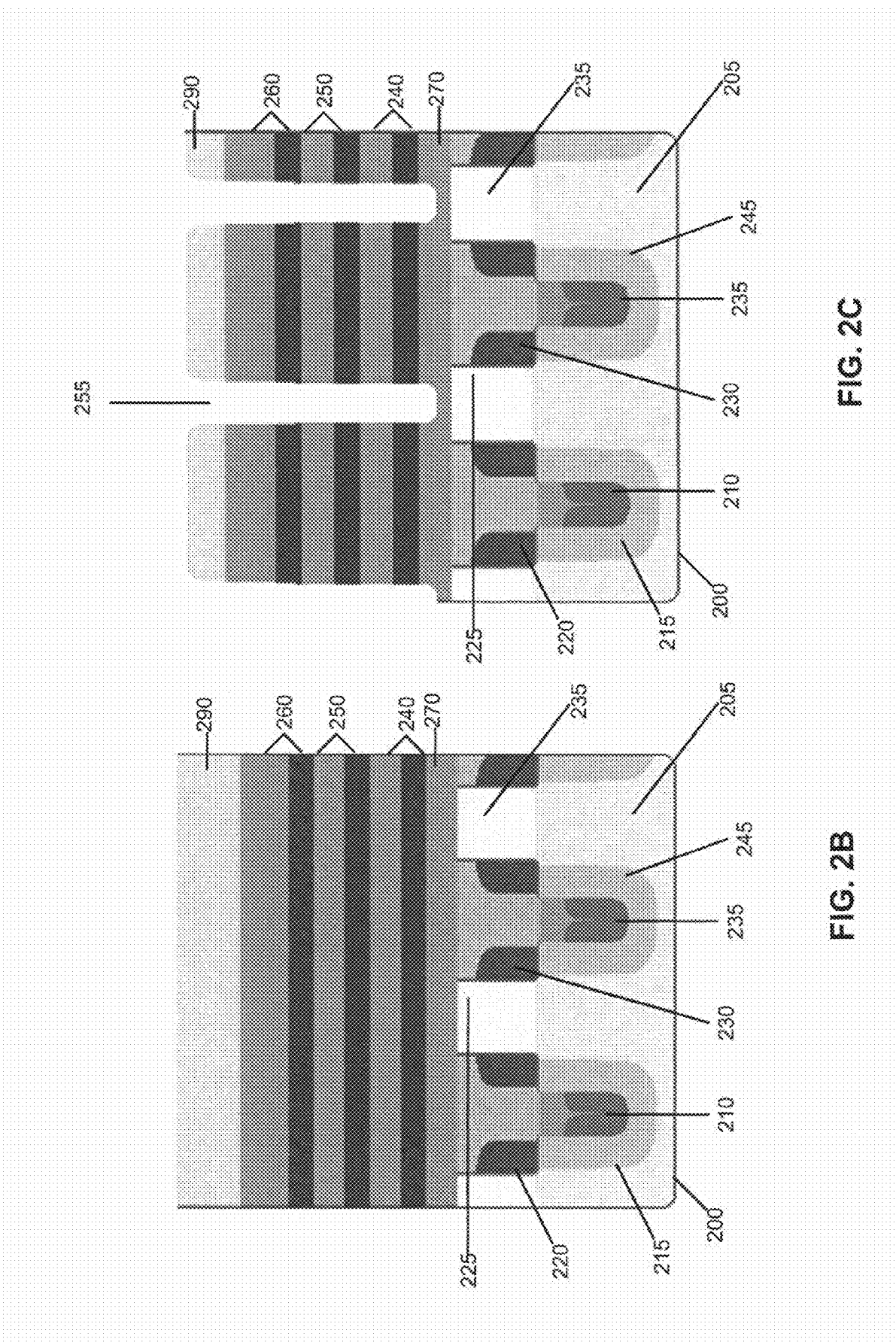

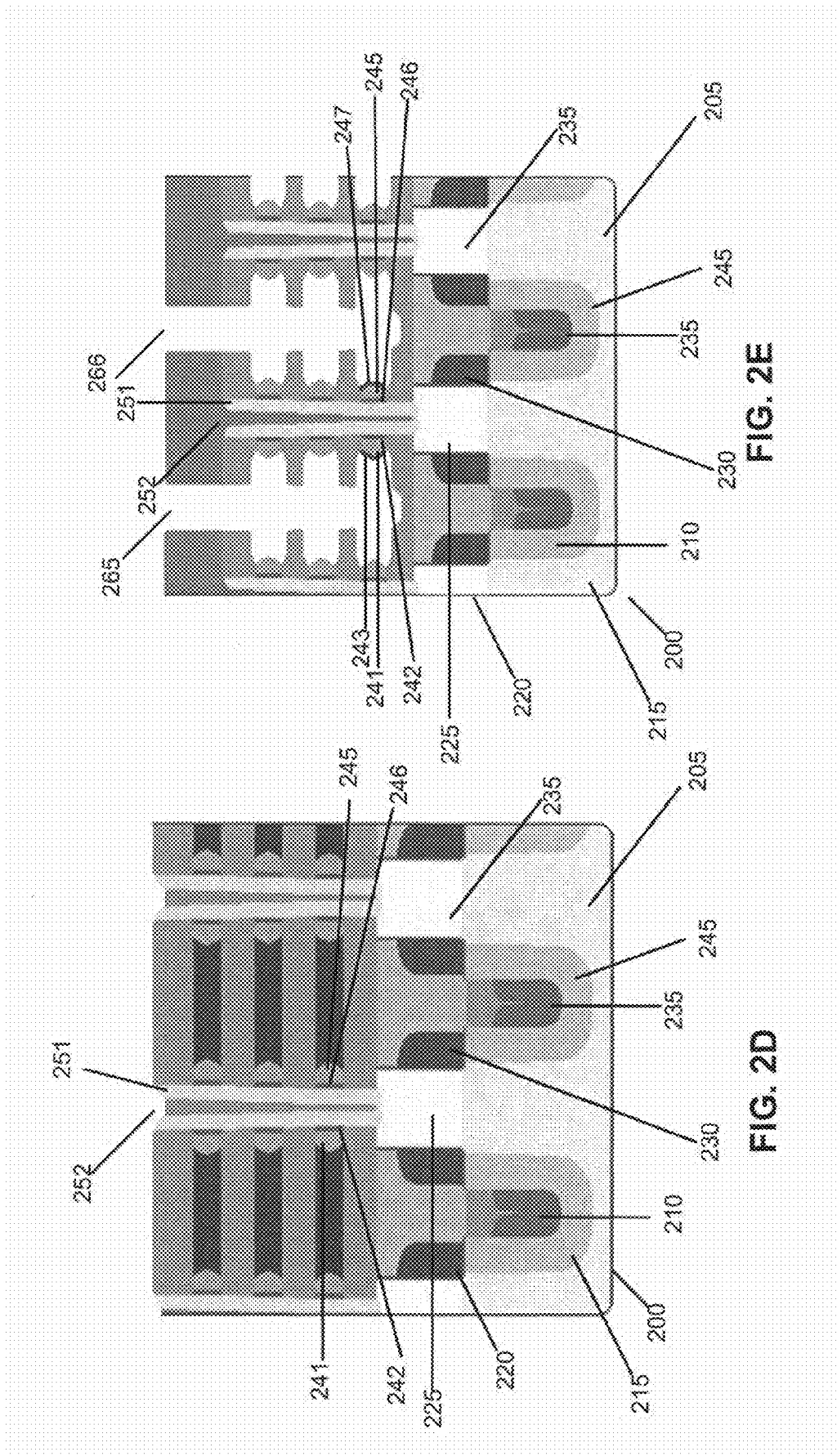

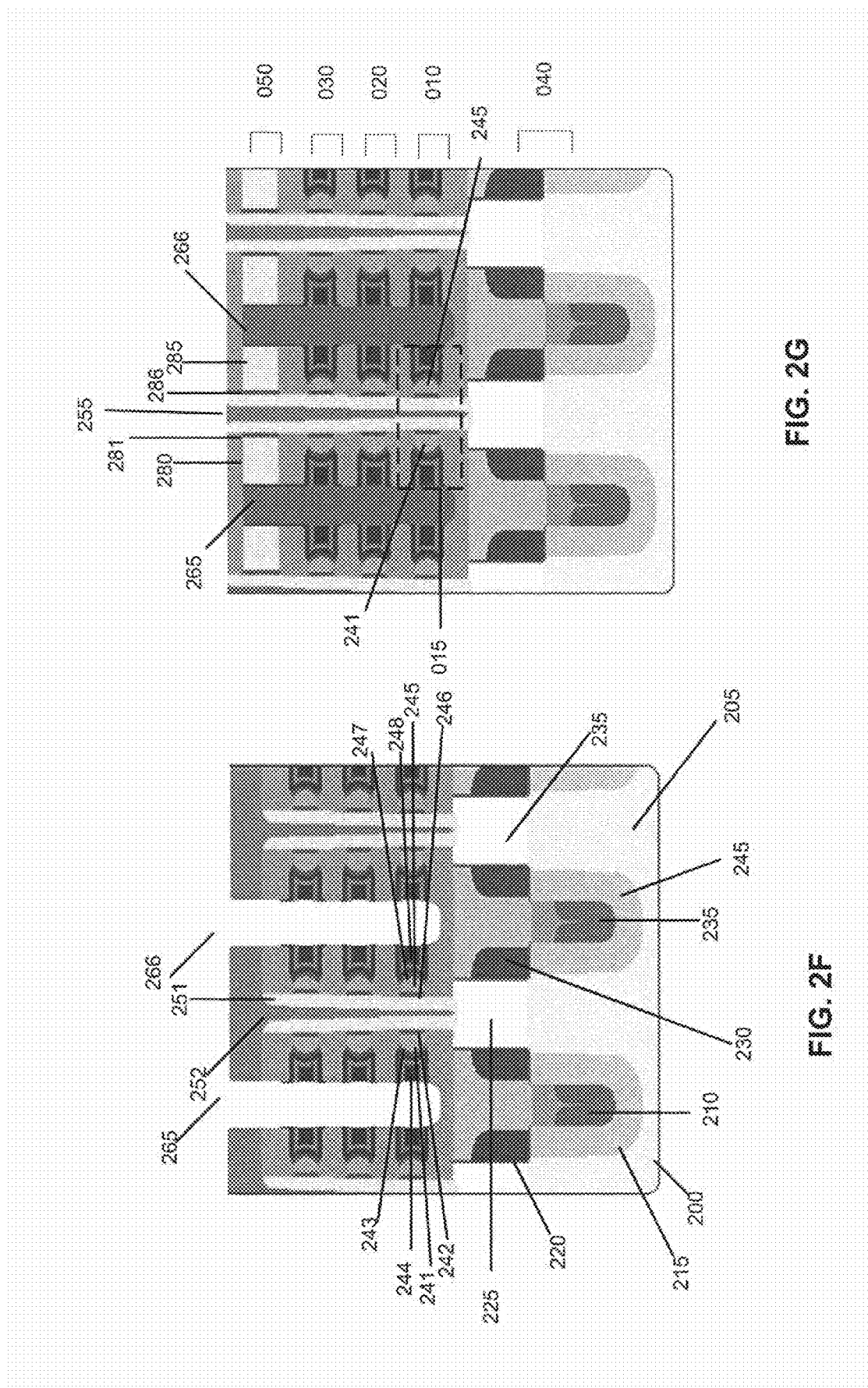

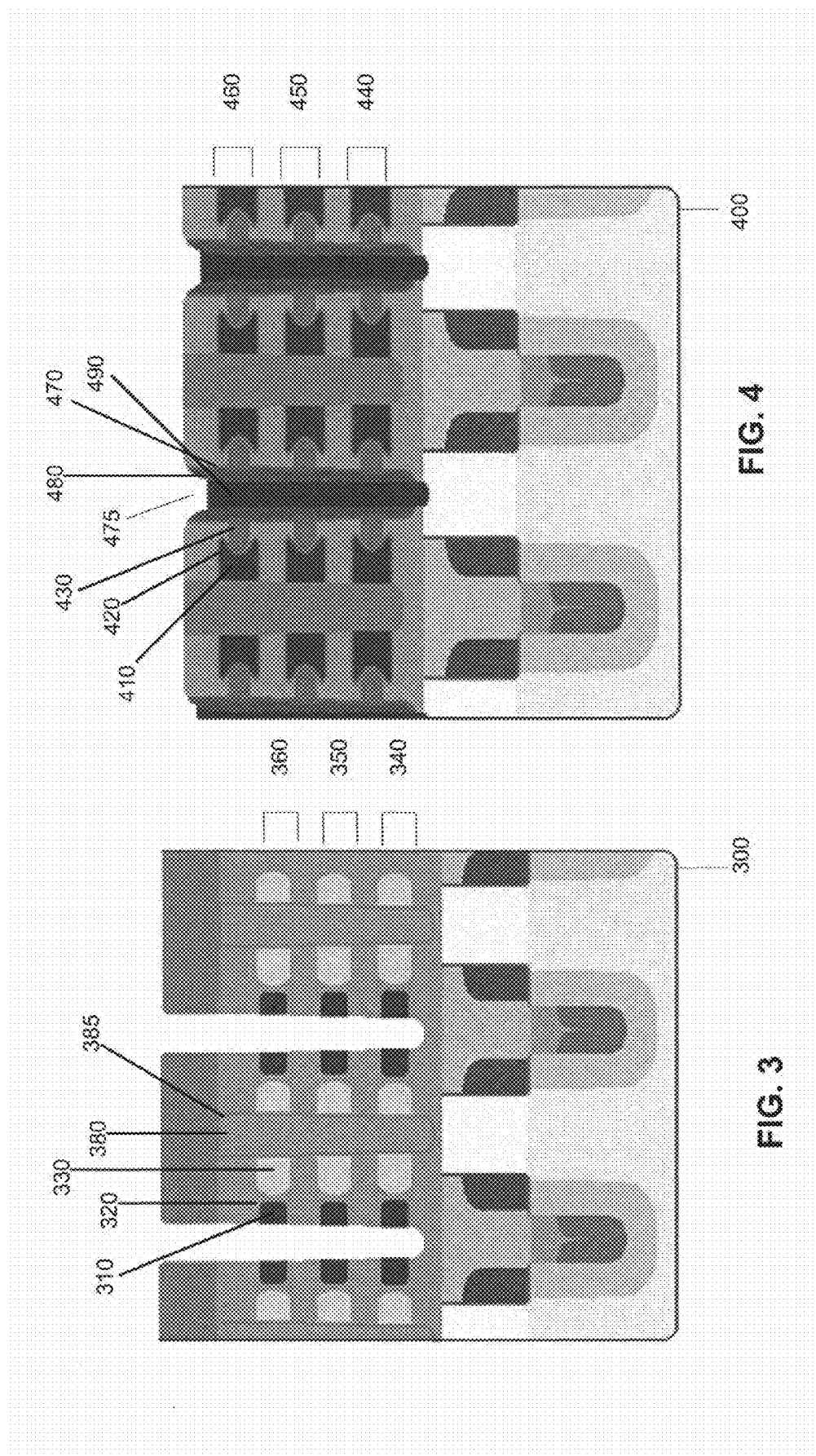

MULTI-CELL VERTICAL MEMORY NODES

FIELD

Embodiments of the present invention generally pertain to memory, and more specifically to increased physical cell density in vertical NAND memory nodes.

BACKGROUND

As integrated circuit processing techniques improve, a reduction in the feature sizes of memory devices is desired in order to increase the density of the IC circuits and memory arrays. The feature size of memory devices may be limited by the device's characteristics rather than the minimum feature size that the process is capable reaching. In NAND Flash memory arrays, for example, as the channel length and the spacing between memory cells in memory strings are reduced, a minimum size is reached that is primarily dictated by the operational characteristics of the floating gate memory cells that make up the memory strings.

NAND architecture memory strings and memory arrays formed by vertical NAND memory cells have been created to increase the density of memory devices. Vertical NAND memory architecture known in the art comprises a single physical cell per memory node. Prior art fabrication techniques have failed to increase the physical memory cell/memory node ratio, thus limiting the cell density of NAND architecture memory strings and memory arrays.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIGS. 2A-2H illustrate diagrammatic, cross-sectional views of various stages of an example embodiment process for forming multi-cell memory nodes.

FIG. 3 illustrates a non-volatile memory device comprising multi-cell memory nodes, wherein each memory cell comprises a polysilicon diode.

FIG. 4 illustrates a non-volatile memory device comprising multi-cell memory nodes, wherein each memory cell comprises an MiM or MiiM diode.

Figure 1:
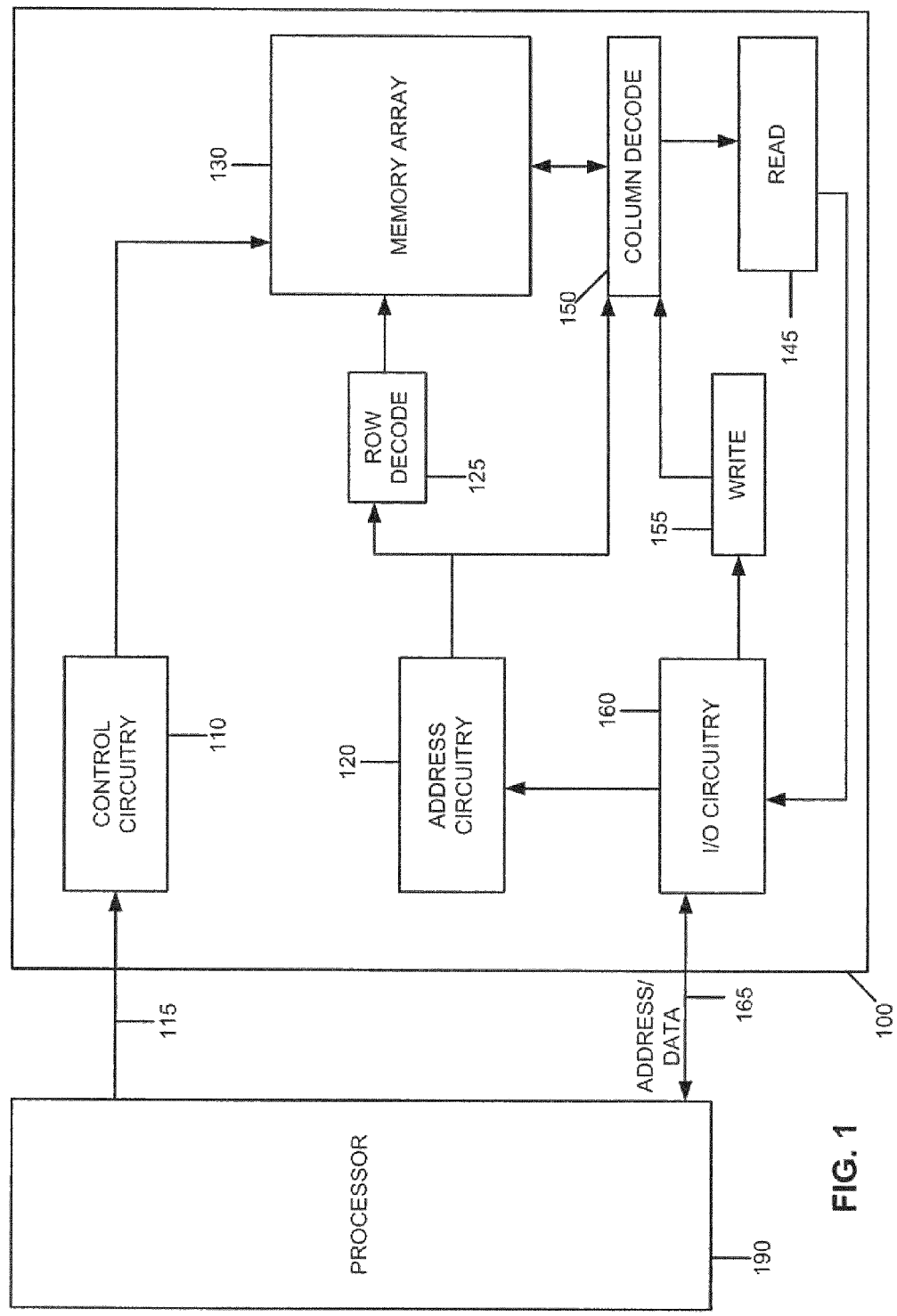
FIG. 1 illustrates a block diagram of a non-volatile memory device that may incorporate embodiments of the multi-cell memory nodes described herein.

The descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

The following description provides examples, such as material types, etch chemistries, and processing conditions, in order to provide a thorough description of embodiments of the present invention; however, a person of ordinary skill in the art will understand the present invention may be practiced without employing these specific details.

Process acts and structures necessary to understand the embodiments of the present invention are described in detail below. The description below does not form a complete process flow for manufacturing a semiconductor device, and the semiconductor structures described below do not form a complete semiconductor device. Additional acts to form complete semiconductor devices from the semiconductor structures may be performed by fabrication techniques known in the art.

The embodiments of the invention provide memory nodes with increased memory cell density for use in a memory structure, such as an array of vertical NAND memory nodes. The NAND strings may be vertically oriented, such that at least one memory cell is located over another memory cell. Thus, the increased memory cell per node density, combined with the vertical structure of the NAND nodes, will produce a higher density of memory cells per unit area of any semiconductor material.

In one embodiment, a NAND memory unit may include a vertically oriented channel. The vertically oriented channel may separate a lower source region from an upper drain region. Said NAND memory unit may further include one or more memory nodes surrounding the vertically oriented channel. Each memory node may include two non-volatile memory cells formed on opposing sides of the vertically oriented channel. Each memory node may further include corresponding control gates for each non-volatile memory cell.

In one embodiment, a stack of memory nodes may utilize two lower source regions and two lower drain regions, each source/drain region corresponding to different "sides" of the vertically oriented channel.

Thus, embodiments of the present invention may be used in high density vertical NAND architecture memory strings, arrays, and devices. Said memory devices are thus able to take advantage of the feature sizes that semiconductor fabrication processes are generally capable of and still allow for appropriate device sizing for operational considerations. This is especially true for NAND flash memory devices, where small changes in the memory cell footprint (e.g., memory cell channel widths) and the cell density in the array can have a large effect on the overall array size and the resulting storage capacity.

Illustrations included herein are not drawn to scale and are not meant to be actual views of any particular semiconductor structure or semiconductor device. Rather, the illustrations are merely idealized representations that are employed to describe the present invention. Additionally, elements common between illustrations may retain the same numerical designation.

FIG. 1 illustrates a block diagram of a memory device that may incorporate embodiments of the memory nodes described herein. Memory device 100 is operatively coupled to processor 190. Memory device 100 has been simplified to focus on features of the memory that are helpful in understanding the present invention.

The memory device includes an array of vertical memory nodes 130. In one embodiment, the memory nodes included in memory array 130 are vertically formed memory nodes, each node comprising two floating gate memory cells. Memory array 130 may comprise memory nodes arranged in banks of rows and columns. The control gates of each row of memory cells may be coupled with a wordline while the drain and source connections of the memory cells may be coupled to bitlines.

Address buffer circuitry 120 is provided to latch address signals provided on address/data bus 165. Address signals are received and decoded by row decoder 125 and a column decoder 150 to access memory data stored in memory array 130. Those skilled in the art know that the size of the address input on address/data bus 165 depends on the density and architecture of the memory array 130—i.e., the size of the input address increases with both increased memory node volume and increased array bank and block volume.

Data input and output buffer (I/O) circuitry 160 is included for bi-directional data communication over a plurality of data connections in address/data bus 165 with processor 190. Write circuitry 155 may provide write data to memory array 130. Read circuitry 145 may read and latch data from the memory array 130.

Control circuitry 110 may decode signals 115 provided from processor 190. These signals control the operations on memory array 130, including data read, data write, and erase operations.

Figure 2A:
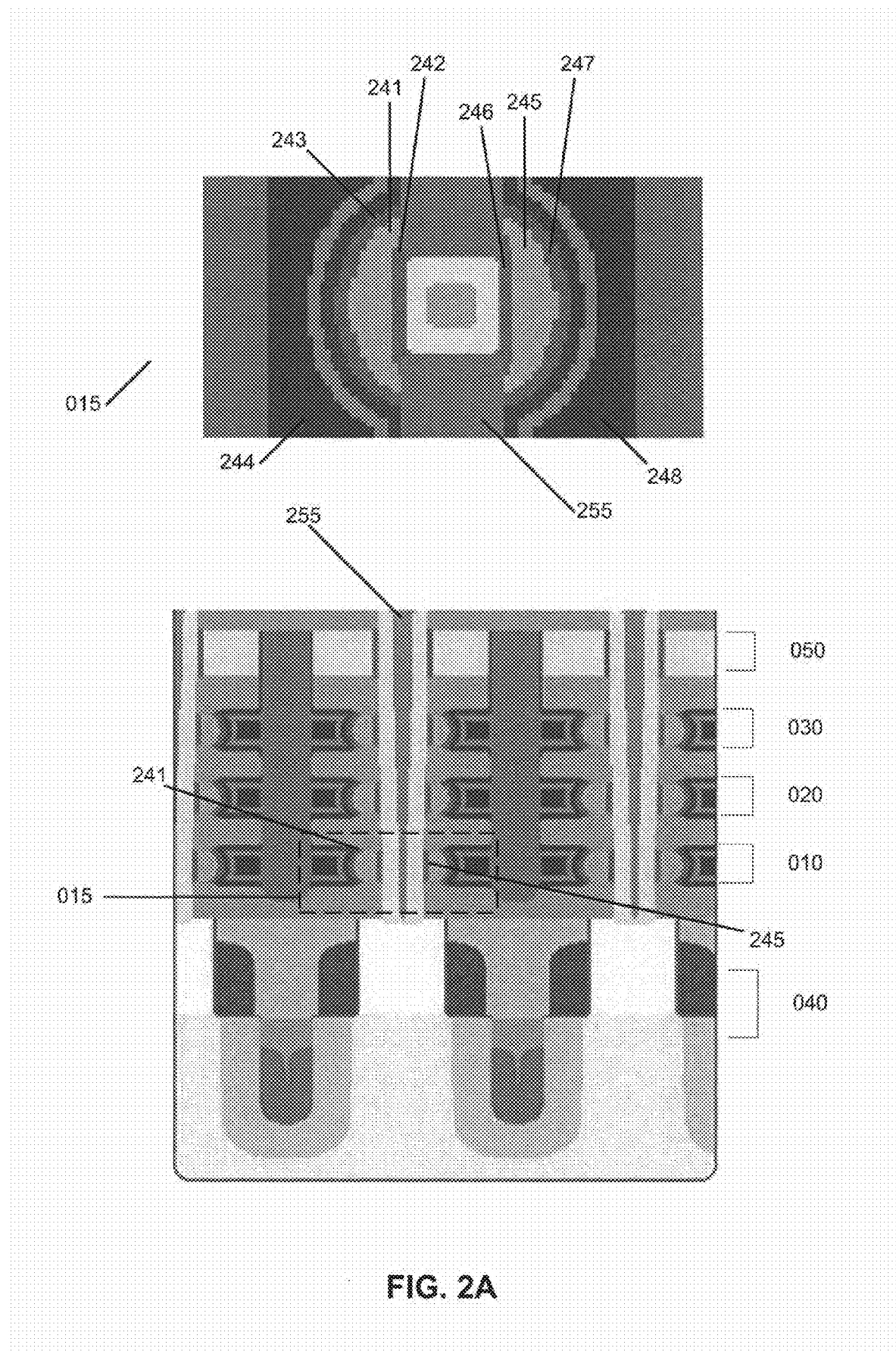

FIG. 2A illustrates a top-view and a side view of an example embodiment of a two-cell memory node. Memory node 015 includes memory cells 241 and 245. As illustrated in FIG. 2A, the increased density in memory node 015 is a result of memory cells 241 and 245 being positioned on opposing sides of vertical thin film transistor (TFT) channel 255 separating source regions 040 from drain regions 050. Thus, memory node 015 contains two memory cells, as opposed to prior art memory nodes, which typically include only one memory cell per node as a result of utilizing only one "side" of a channel separating source and drain regions (i.e., memory cells are formed only on one side of the channel).

The top view of memory node 015 illustrates how the multiple gates may be structured. In this example, memory node 015 comprises floating gate memory cells 241 and 245. Dielectric layer 242 (e.g., tunneling oxide) separates floating gate memory cell 241 from TFT channel 255, and dielectric layer 246 separates floating gate memory cell 245 from TFT channel 255.

Control gate 244 is included in memory node 015 to control floating gate memory cell 241, and is separated from floating gate memory cell 241 by blocking dielectric layer 243. Control gate 248 is further included in memory node 015 to control floating gate memory cell 245, and is separated from floating gate memory cell 245 by blocking dielectric layer 247. Blocking dielectric layers 243 and 247 may comprise a laminate including silicon dioxide, nitride, and a high-k dielectric.

Thus, a memory device may achieve increased memory cell density by including memory nodes designed similar to that of memory node 015, wherein said memory nodes would be structured into tiers similar to those of memory node tiers 010, 020 and 030.

FIGS. 2B-2H illustrate diagrammatic, cross-sectional views of various stages of an example embodiment process for forming multi-cell memory nodes. For the purposes of simplification, the following processing acts will describe the formation of memory node 015, while the figures will include illustrations of the formation of other surrounding memory nodes. Those skilled in the art would know that the following processing acts may be applied to multiple tiers of cell stacks in order to achieve a NAND memory unit comprising an array of memory nodes described herein.

FIG. 2B illustrates an initial state of an example patterning stack subject to proceedings acts according to an embodiment of the invention. Patterning stack 200 includes dual gate select gate sources (SGS) 220 and 230 for connecting a common source line to the memory nodes described below. In the embodiment illustrated, dual gate SGS 220 and 230 are metal multigate MOSFETs with EPI-channels 225 and 235 serving as their respective channels. Patterning stack 200 further includes buried source contact (CS) lines 210 and 240 strapped to doped N-LDDs (lightly doped drains) 215 and 245 respectively. CS lines 210 and 235 and N-LDDs 215 and 245 are included in P-Well 205.

Patterning stack 200 further includes cell stacks 240, 250 and 260. Each of said cell stacks comprises an oxide layer (comprising, e.g., tetraethoxysilane (TEOS)) and a nitride layer. As stated above, illustrated representations of said cell stacks are not drawn to scale (for example, each layer may by 40-70 nm thick). As described below, each cell stack will eventually form a tier of memory nodes, and thus cell stacks 240, 250 and 260 will form memory node tiers 010, 020 and 030 of FIG. 2A respectively.

The inclusion of three cell stacks in patterning stack 200 is for illustrative purposes only. Those skilled in the art would know that for any process to generate n-tiers of memory cells, n cell stacks would be utilized in the subsequent processing acts.

Patterning stack 200 further includes oxide cap layer 270 beneath cell stacks 240. Poly hard mask 290 may top patterning stack 200.

FIG. 2C illustrates patterning stack 200 subject to two perpendicular channel cuts to form vertical channel 255. Vertical channel 255 as illustrated is etched to leave some of oxide layer 270 atop EPI channel 225. Vertical channel 255 may be formed by "printing" a first set of slots on stack 200 (stopping at oxide cap 270), filling the first sets of slots with oxide, and "printing" a second set of slots on stack 200, wherein the second sets of slots are perpendicular to the first set. "Printing" as described herein may refer to lithography patterning or etching processes (e.g., reactive ion etching (RIE)) known in the art.

FIG. 2D illustrates nitride layers of cell stack 240 undercut to form voids for memory cells 241 and 245. The undercuts may determine the resulting memory cells final thickness and may be executed via any known method in the art—e.g., a controlled time etch with hot phosphoric acid to undercut the nitride to a predetermined depth/width. Said voids may then be deposited with FG poly to form memory cells 241 and 245 (this may involve, for example, depositing FG poly to fill the channel 255 then executing a blanket silicon etch to leave FG poly only in the voids).

Any thin residual layer in each of the filled voids may be oxidized to form gate dielectrics 242 and 246 to separate each of the filled voids from vertical channel 255.

Vertical TFT channel 255 may formed by depositing TFT poly spacer 251 in the channel. TFT channel 255 as illustrated includes airgap 252 created to address any potential electrical interference issues. TFT channel 255 may be created by punching (or any other suitable process known in the art, e.g., etching) the bottom of TFT poly spacer 251 and clearing the remaining oxide over EPI channel 225, and depositing another thin TFT to strap TFT poly spacer 251 to EPI channel 225.

FIG. 2E illustrates openings 265 and 266 formed on patterning stack 200. Openings 265 and 266 may be formed in a manner similar to vertical channel 255 as described above.

The remaining nitride may be completely removed from cell stack 240 by subjecting openings 265 and 266 to processing acts known in the art (e.g., WNS to completely remove nitride). In one embodiment, oxide around each filled void is pushed back to provide more room to reduce the operating voltage of the subsequent formed control gates (described below). The openings between the oxide tiers (formed by removing the remaining nitride) may be widened to provide room for future blocking dielectric and control gate metal. Any thin residual in each of the exposed filled voids may be oxidized to form part of blocking gate dielectrics 243 and 247 for memory cells 241 and 245 respectively.

FIG. 2F illustrates control gates 244 and 248 formed by depositing a metal gate adjacent to gate dielectrics 243 and 247 respectively. Metal gates 244 and 248 may comprise TaN, TiN, W, Si, or any combination thereof. A blanket etch may be performed to separate control gates of other neighboring memory nodes.

Select gate drain (SGD) regions 280 and 285 are subsequently formed, as illustrated in FIG. 2G. SGD regions 280 and 285 may be separated from vertical TFT channel 255 via dielectric layers 281 and 286 respectively (which may be formed, for example, when dielectric layers 242 and 246 are formed). Thus, SGD region 285 is associated with memory cell 241, and SGD region 280 is associated with memory cell 245. Openings 265 and 266 are filled with oxide to separate memory node 015 from other memory nodes. Thus memory node 015, as shown in FIG. 2A, is formed.

Figure 2H:
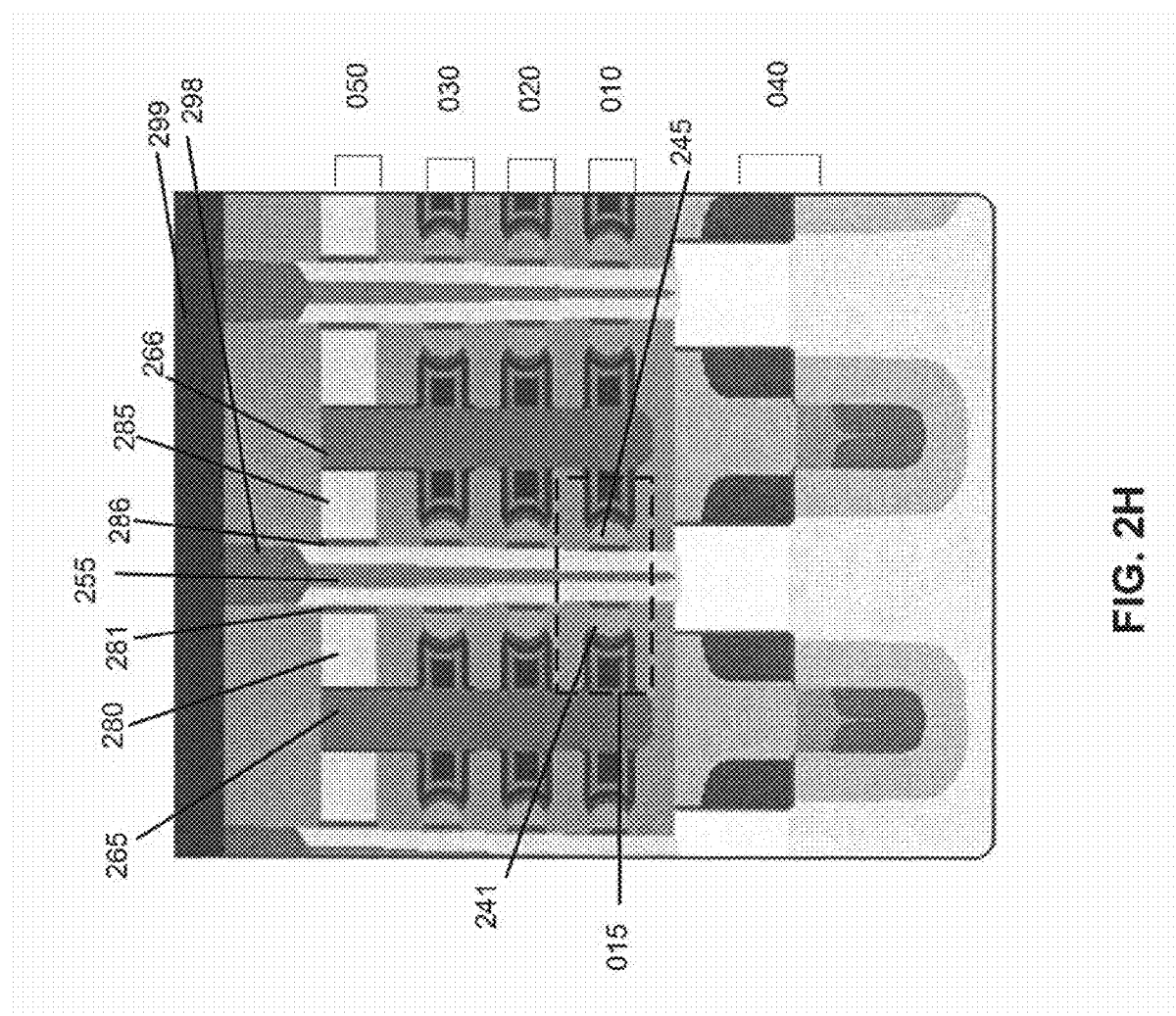

FIG. 2H illustrates that contact plug 298 may be formed atop vertical TFT channel 255, and metal bitline 299 may be formed above contact plug 298. Thus, contact plug 298 may be formed to operatively couple bitline 299 to (at least) vertical channel 255.

The use of floating gate memory, as described above, is only one embodiment of a multi-cell memory node. Those skilled in the art would know that minor modifications could be made to the structure of FIG. 2A to comprise RRAM, memristor RAM, Oxide RAM or OTPROM. The memory node structure of two memory cells on opposing sides of a vertical channel separating a source region and a drain region may be applicable for memory cells comprising polysilicon, metal-insulator-metal (MiM) or metal-insulator-insulator-metal (MiiM) diode.

FIG. 3 illustrates non-volatile memory device 300 comprising multi-cell memory nodes in tiers 340, 350 and 360, wherein each memory cell comprises a polysilicon diode. The memory cells of memory device 300 are P-poly metal electrodes comprising metal layer 310, P+ poly layer 320 and N+ poly layer 330. Each of said memory cells are positioned on opposing sides of vertical channel 380, which comprises polysilicon and TEOS liner 385.

FIG. 4 illustrates non-volatile memory device 400 comprising multi-cell memory nodes in tiers 440, 450 and 460, wherein the memory cells comprise an MiM or MiiM diode. The memory cells of memory device 400 comprise metal layer 410, thin insulator layer (or layers for MiiM diodes) 420 and metal layer 430. Each of said memory cells are positioned on opposing sides of vertical channel 475, which comprises cell element 470, metal cap 480 and metal fill layer 490.

It is noted that terms like "preferably," "commonly," and "typically" are not utilized above to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

Having described the invention in detail and by reference to specific embodiments thereof, it will be apparent that modifications and variations are possible without departing from the scope of the invention defined in the appended claims.

More specifically, although some aspects of the present invention are identified herein as preferred or particularly advantageous, it is contemplated that the present invention is not necessarily limited to these preferred aspects of the invention. Many modifications may be made to adapt the teachings of the present invention to a particular situation without departing from the scope thereof.

The invention claimed is:
1. A NAND memory device comprising:
a vertically oriented channel separating a lower source region and an upper drain region;
a plurality of memory nodes surrounding the vertically oriented channel, the plurality of memory nodes comprising at least two memory nodes stacked vertically and disposed between the lower source region and the upper drain region, each memory node including
a first control gate,
a first non-volatile memory cell between the vertically oriented channel and the first control gate,
a second control gate, and
a second non-volatile memory cell between the vertically oriented channel and the second control gate;
wherein the first and second non-volatile memory cells of each memory node are positioned on opposing sides of the vertically oriented channel.

2. The NAND memory device of claim 1, wherein the first and second non-volatile memory cell each comprises a floating gate cell, and each of the memory nodes further comprises:
a first gate dielectric layer between the first non-volatile memory cell and the vertically oriented channel; and
a second gate dielectric layer between the first non-volatile memory cell and the vertically oriented channel.

3. The NAND memory device of claim 1, wherein the first and second non-volatile memory cell each comprises a metal-insulator-metal (MIM) diode.

4. The NAND memory device of claim 1, wherein the first and second non-volatile memory cell each comprises a polysilicon diode.

5. The NAND memory device of claim 1, wherein the upper drain region further comprises:
a first drain region above the first control gate; and
a second drain region above the second control gate, wherein the first and second drain regions are positioned on opposing ends of the vertically oriented channel.

6. The NAND memory device of claim 1, further comprising:
a lightly doped drain region adjoining the lower source region.

7. A system comprising:
a processor; and
a memory device operatively coupled to the processor, the memory device to include
a vertically oriented channel separating a lower source region and an upper drain region,
an array of at least two memory nodes stacked vertically and disposed between the lower source region and the upper drain region, wherein each memory node comprises
a first control gate,
a first non-volatile memory cell between the vertically oriented channel and the first control gate,
a second control gate, and
a second non-volatile memory cell between the vertically oriented channel and the second control gate, wherein the first and second non-volatile memory cells are positioned on opposing sides of the vertically oriented channel, control circuitry to receive signals from the processor and to control operations on the array of memory nodes, and I/O circuitry to transfer memory data between the array of memory nodes and the processor.

8. The system of claim 7, wherein the first and second non-volatile memory cell each comprises a floating gate cell, and each of the plurality of memory nodes further comprises:

a first gate dielectric layer between the first non-volatile memory cell and the vertically oriented channel; and a second gate dielectric layer between the first non-volatile memory cell and the vertically oriented channel.

9. The system of claim 7, wherein the first and second non-volatile memory cell each comprises a metal-insulator-metal (MIM) diode.

10. The system of claim 7, wherein the first and second non-volatile memory cell each comprises a polysilicon diode.

11. The system of claim 7, wherein the upper drain region further comprises:

a first drain region above the first control gate; and a second drain region above the second control gate, wherein the first and second drain regions are positioned on opposing ends of the vertically oriented channel.

12. The system of claim 7, each memory node further comprising:

a lightly doped drain region adjoining the lower source region.

13. The system of claim 12, wherein the lightly doped drain region comprises an n-type Lightly Doped Drain (N-LDD).

* * * * *